United States Patent [19]

Kasai

[11] Patent Number: 4,933,645
[45] Date of Patent: Jun. 12, 1990

[54] AMPLIFIER HAVING A CONSTANT-CURRENT BIAS CIRCUIT

[76] Inventor: Takafumi Kasai, 13-28, Higashi-cho 4-chome, Koganei-shi, Tokyo, Japan, 184

[21] Appl. No.: 243,337
[22] PCT Filed: Nov. 21, 1987
[86] PCT No.: PCT/JP87/00905
§ 371 Date: Jun. 23, 1988
§ 102(e) Date: Jun. 23, 1988
[87] PCT Pub. No.: WO88/04115
PCT Pub. Date: Jun. 2, 1988

[30] Foreign Application Priority Data

Nov. 21, 1986 [JP] Japan ............... 61-276474

[51] Int. Cl.[5] .............................. H03F 3/30
[52] U.S. Cl. ........................... 330/255; 330/265; 330/267
[58] Field of Search ............. 330/255, 265, 267, 268, 330/270, 273, 274

[56] References Cited

U.S. PATENT DOCUMENTS

| | | | |
|---|---|---|---|
| 3,536,958 | 10/1970 | Sondermeyer | 307/255 X |
| 4,331,930 | 5/1982 | Shibata et al. | 330/267 |
| 4,366,447 | 12/1982 | Sugiyama | 330/267 |
| 4,384,261 | 5/1983 | Yokoyama | 330/267 |

FOREIGN PATENT DOCUMENTS

| | | |
|---|---|---|
| 048452 | 9/1977 | Japan . |
| 114410 | 9/1981 | Japan . |
| 116713 | 9/1981 | Japan . |
| 208713 | 12/1982 | Japan ............... 330/265 |
| 150307 | 9/1983 | Japan ............... 330/265 |
| 48311 | 11/1983 | Japan ............... 330/267 |
| 49367 | 1/1985 | Japan . |
| 38641 | 8/1986 | Japan . |

OTHER PUBLICATIONS

Journal of the Audio Engineering Society, vol. 30 (1982), May, No. 5, New York, U.S.A.

Primary Examiner—James B. Mullins
Attorney, Agent, or Firm—Darby & Darby

[57] ABSTRACT

In an amplifier comprising an input stage having an inverting input terminal and a non-inverting input terminal, a voltage amplifier stage operatively connected to said input stage, and a SEPP output stage including first and second control ends connected to first and second relay output terminals of said voltage amplifier stage respectively, it is characterized by comprising a constant-current bias (CCB) circuit connected between the first and second relay output terminals so as to absorb the current bypassing between said relay output terminals. The first CCB circuit is connected in parallel to a so called constant-voltage bias circuit whose internal resistance has been increased as compared with that in the conventional CVB circuit so that most portion of the bias current borne by the CVB circuit is shared by the present CCB circuit. The second CCB circuit is a negative feedback-type CCB circuit which is controllable by means of a control voltage which is derived from a mean voltage generated from emitter resistor of power transistors, i.e., from the mean value of a voltage generated between the first and second resistors.

6 Claims, 7 Drawing Sheets

AMPLIFIER HAVING A CONSTANT-CURRENT BIAS CIRCUIT

FIELD OF THE INVENTION

The present invention relates to an amplifier having a constant-current bias circuit. The amplifier comprises an input stage, a voltage amplified stage having first and second relay terminals and a SEPP output stage having at least one pair of complementary transistors. A bypass current, which is obtained by subtracting a control current flowing between bases of the transistors of the output stage from the current supplied to the first and second relay output terminals, is absorbed by a constant-current element or a constant-current circuit. Alternatively, the voltage appearing between two resistors each directly connected to an output terminal is integrated and then negatively fed back to a voltage-controlled constant-current bias circuit which absorbs the bypass current, thereby to determine the bias of the SEPP output stage.

BACKGROUND OF THE INVENTION

Figure 1:
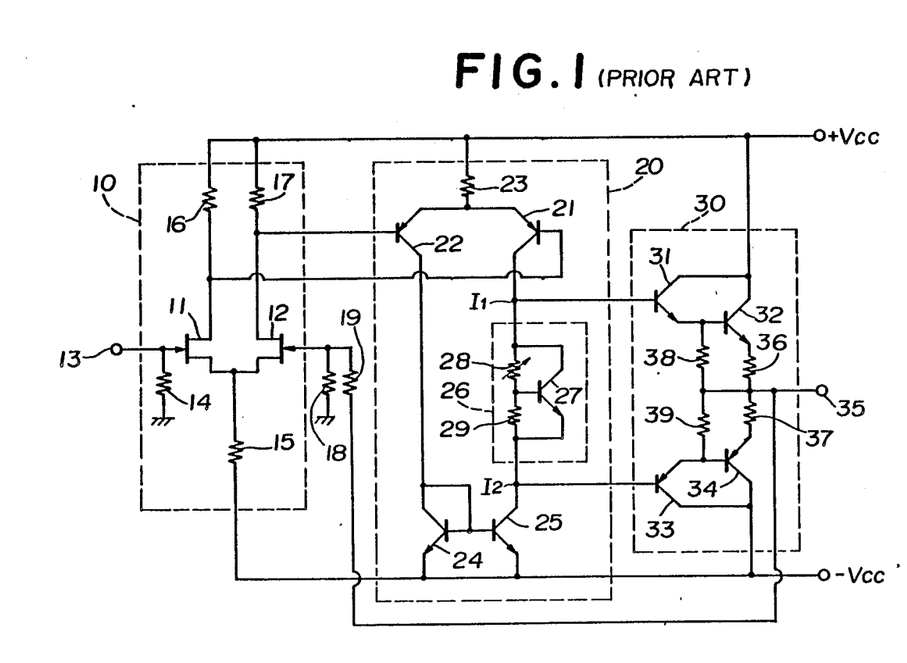
FIG. 1 is a circuit diagram of a conventional class AB amplifier.

A conventional amplifier comprises, as shown in FIG. 1 for example, an input stage 10, a voltage amplified stage 20 and a SEPP (Single Ended Push-Pull) output stage 30.

The input stage 10 includes a pair of FETs 11 and 12 of monolithic IC, an input terminal 13 connected to the gate of FET 11, an input resistor 14 connected between input terminal 13 and the ground, a resistor 15 connected between the common source of FETs 11 and 12 and a negative power supply −Vcc, and resistors 16 and 17 which are connected between a positive power supply +Vcc and the respective drain of FETs 11 and 12. The gate of FET 12 to the ground and the output terminal are connected negative feedback resistors 18 and 19 which determine the gain or amplification factor of the amplifier.

The voltage amplified stage 20 includes a PNP transistor 21 having a base connected to the drain of FET 11, a PNP transistor 22 having a base connected to the drain of FET 12, a resistor 23 connected between the common emitter of PNP transistors 21 and 22 and the positive power supply +Vcc, an NPN transistor 24 having a collector and a base which are connected to the collector of PNP transistor 22, and an NPN transistor 25 having a base connected to the collector of PNP transistor 22. These NPN transistors 24 and 25 have emitters each connected to the negative power supply −Vcc. The absolute value of the collector current of PNP transistor 22 is substantially equal to that of NPN transistor 25. The collector of PNP transistor 22 provides a first relay output terminal $I_1$ while the collector of NPN transistor 25 provides a second relay output terminal $I_2$.

The SEPP output stage 30 has Darlington-connected NPN transistors 31 and 32 each having a collector connected to the positive power supply +Vcc, Darlington-connected PNP transistors 33 and 34 each having a collector connected to the negative power supply −Vcc, an output terminal 35, a first resistor 36 directly connected to output terminal 35 and connected to the emitter of NPN transistor 32, and a second resistor 37 directly connected to output terminal 35 and connected to the emitter of PNP transistor 34. The junction between the emitter of NPN transistor 31 and the base of NPN transistor 32 is connected to output terminal 35 via resistor 38, while the junction between the emitter of PNP transistor 33 and the base of PNP transistor 34 is connected to output terminal 35 via resistor 39. The constant-voltage bias (CVB) circuit 26 is connected between first relay output terminal $I_1$ connected to the base (first control end) of NPN transistor 31 and second relay output terminal $I_2$ connected to the base (second control end) of PNP transistor 33.

The bias circuit 26 includes a temperature-compensation NPN transistor 27 having a collector connected to the base of NPN transistor 31 and an emitter connected to the base of PNP transistor 32, a variable resistor 28 connected between the bases of NPN transistors 31 and 27, and a fixed resistor 29 connected between the bases of NPN transistor 27 and PNP transistor 33. The idle current flowing between collectors of NPN transistor 32 and PNP transistor 34 is regulated to class AB through adjustment of variable resistor 28. The voltage between the collector and the emitter of NPN transistor 27 has a value which is obtained by adding the resistances of variable resistor 28 and that of the fixed resistor 29 to produce a sum value, dividing the sum value by that of fixed resistor 29, and multiplying the quotient with the base-emitter voltage $V_{be}$ across NPN transistor 27. In the conventional CVB circuit 26, since the voltage $V_{be}$ is substantially constant, the bias voltage between the first and second relay output terminals is maintained constant.

In the operation of this class AB amplifier, for example, when NPN transistor 31 and 32 are driven to the plus voltage side, PNP transistor 33 and 34 are also driven to the plus voltage side through the CVB circuit. More specifically an increase in the base currents of NPN transistors 31 and 32 causes the collector currents to increase correspondingly, as well as the respective base to emitter voltage $V_{be}$ of NPN transistors 31 and 32. The voltage across first resistor 36 also increase as a result of the increase in the collector current. In consequence, since the voltage between the collector and the emitter of NPN transistor 27 is substantially constant, the voltage applied between the emitters and the bases of PNP transistors 33 and 34 are reduced to turn off PNP transistors 33 and 34.

In general, bipolar transistors such as NPN or PNP transistors require a certain transition time for transiting from the "off" state to the "on" state, in order to charge up the holes or the electron carriers. Thus the charging time causes an unfavourable effect on the characteristics of the amplifier.

The PNP transistors 33 and 34 require, when driven to the minus voltage side from the completely "off" state, carrier currents for charging electrons in the transistors in addition to the base current components proportional to the ordinary collector currents. The carrier currents adversely affect the non-feedback characteristics of the amplifier. When the amplifier is connected to an inductive load such as a loudspeaker, the carrier currents cause unfavourable effects on the output such as the quality of the sound, due to time lag in the switching between "on" and "off" states of NPN transistors 31 and 32 and PNP transistors 33 and 34. In consequence, the conventional amplifier of class AB has suffered from a problem in that the quality of the sound is impaired to a degree which is not measurable by ordinary measuring instrument, due to the use of the CVB circuit.

DISCLOSURE OF THE INVENTION

Accordingly, an object of the invention is to provide an amplifier in which problems attributable to the carrier current is overcome by virtue of the use of a constant-current bias (CCB) circuit.

This CCB circuit, when used in an embodiment implemented to a commercial amplifier of class AB or B, provides a remarkable improvement in the quality of the sound as compared to that before improvement, but makes its adjustment difficult as compared with the known arrangement constant.

Two types of CCB circuits are proposed for the purpose of overcoming this problem.

The first CCB circuit is connected in parallel to a CVB circuit having an internal resistance higher than that of the conventional ones, so that a part of the current which flows through the conventional CVB circuit is made to flow through the CCB circuit.

The second CCB circuit is a voltage-controlled feedback-type CCB circuit, the control voltage of which is determined by a negative feedback circuit from a mean value of a voltage generated between the emitter resistors for the power transistors, i.e., between the first and second resistors.

According to the present invention, there is provided an amplifier comprising: an input stage having an inverting input terminal and a non-inverting input terminal, a voltage amplified stage operatively connected to the input stage, and a SEPP output stage having first and second control terminals connected to first and second relay output terminals of the voltage amplifier stage, wherein a CCB circuit is connected between the first and second relay output terminals so as to absorb the electric current bypassing between the first and second relay output terminals. The CCB circuit according to the present invention may be connected in parallel to a CVB circuit.

According to the present invention, there also is provided an amplifier wherein the SEPP output stage comprises a first transistor, a second transistor having a polarity opposite to the first transistor, an output terminal, a first resistor directly connected to the output terminal and connected to an emitter or a source of the first transistor, and a second resistor connected directly to the output terminal and connected to an emitter or a source of the second transistor, and wherein the CCB circuit controls the current value by a control voltage, the CCB circuit being adapted to receive, through an integration circuit, another voltage which appears at both ends of the first and second resistors so as to control the level of the current bypassing between the first and second relay output terminal, thereby controlling the bias current flowing in the first and second resistors.

The present invention is based upon a discovery of a fact that the CCB circuit can remarkably improve the non-feedback characteristic of the amplifier as compared with the conventional CVB circuit. The amplifier of the class AB incorporating a CCB circuit has to be designed in due consideration of the temperature characteristics of the constituent elements such as bipolar or field effect transistors (FETs) and resistors. The CCB circuit itself has also a temperature characteristics. The ASO region of the power transistor used in the output stage also has to be take into consideration.

Thus, the present invention proposes two types of basic circuits making use of CCB circuits.

In the first basic circuit, the operation temperature range of the amplifier is set to fall within the range between 0° and 70° C., and the basic value A of the bias current in this temperature range, as well as fluctuation width B or (A±B), is determined. Subsequently, the basic value C of the current passing the CCB circuit, as well as the fluctuation width D or (C±D) is determined and the set value of the electric current in the CCB circuit is determined to meet the condition of (C+D)≦A, and the remainder bypass current is absorbed by a CVB circuit whose internal resistance is increased to a level which is about (A−B)/B times as high as that of the conventional CVB circuit. All the values A, B, C and D are positive.

In the second basic circuit, the basic value A of the bypass current in the operation temperature range 0° to 70° C. of the amplifier, as well as the fluctuation width B or (A±B), is determined, and a CCB circuit is used which enables the current value to be controlled through a control of voltage over a current range which can completely absorb the fluctuation width B. Therefore, the CCB circuit connected between the first and second relay output terminals receives, through an integration circuit, the voltage which appears across the output resistor connected to the output terminal, whereby a negative feedback is effected to stabilize the idle current of the power transistor of the output stage. The integration circuit eliminates low-frequency component of, for example, 20 Hz or higher flowing through the output resistor. According to the present invention, therefore, the matching between the transistors of the driving stage and the transistors of the SEPP output stage can be attained by a simple adding or subtracting of currents, and the turning of the non-driven transistor of the SEPP output stage to "off" state is prevented, by virtue of the fact that the bias circuit incorporates a constant-current circuit, integration circuit and the negative feedback control technique.

DESCRIPTION OF THE PREFERRED EMBODIMENTS

The invention will be described in more detail through preferred embodiments with reference to the accompanying drawings.

Figure 2:
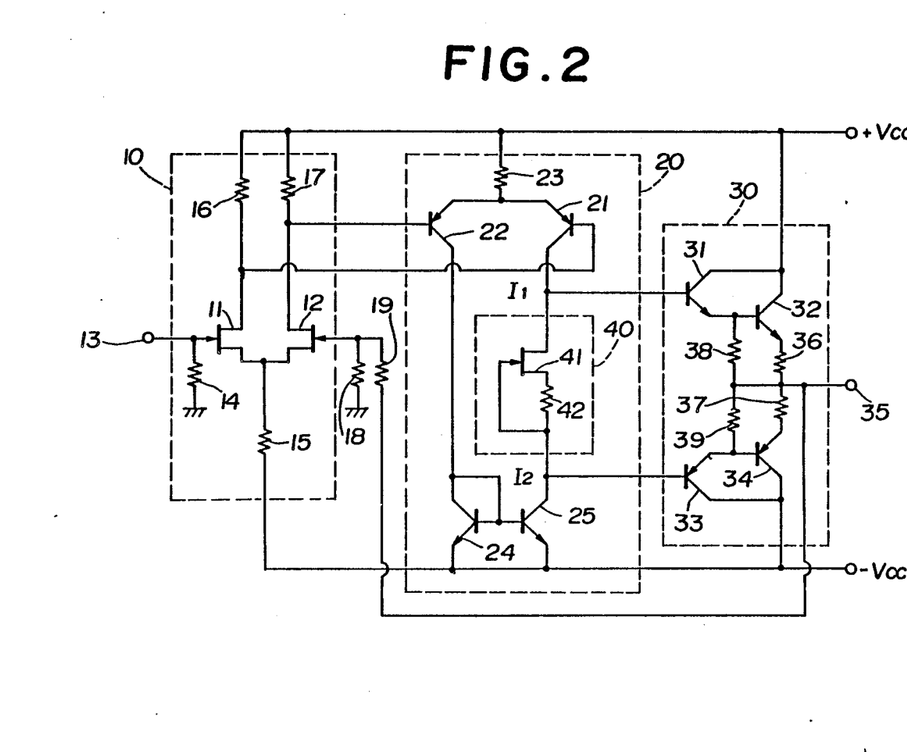
FIG. 2 is a basic circuit diagram of an amplifier provided with a CCB circuit.

FIG. 2 shows a basic circuit of an amplifier constructed in accordance with the present invention. In this drawing, the same reference numerals are used to denote the same parts or members as those used in the embodiment shown in FIG. 1, and detailed description thereof is omitted.

As will be clearly understood from the comparison with the conventional amplifier shown in FIG. 1, the present the amplifier in accordance with the present invention has a CCB circuit 40 in place of CVB circuit 26. The CCB circuit 40 is composed of, for example, a junction-type N-channel FET 41 having a drain connected to first relay output terminal I₁, and a resistor 42 connected to the source of FET 41 and second relay output terminal I₂. The gate of FET 41 is connected to second relay output terminal I₂. The CCB circuit 40 may be for example substituted by a constant-current diode. It will also be clear that a similar circuit arrangement can be obtained by the use of a P-channel FET in place of the N channel FET.

Figure 3:
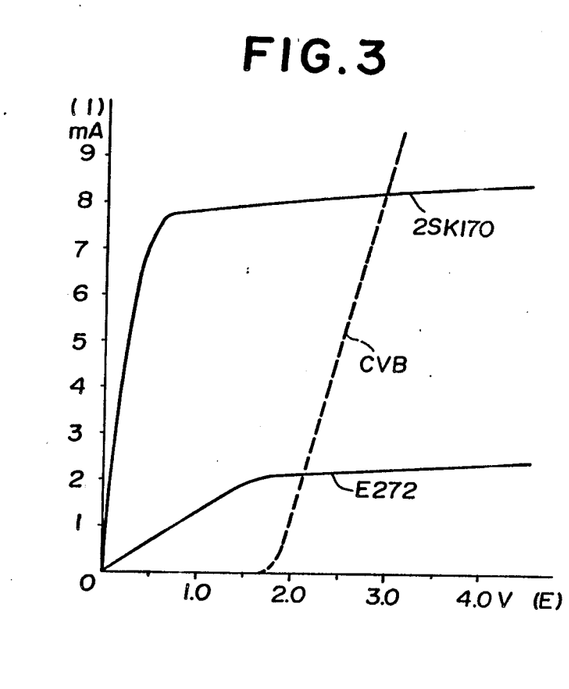
FIG. 3 is a graph showing the voltage vs. current characteristics of a constant-current element, CCB circuit and a constant-voltage bias circuit.

FIG. 3 shows typical current vs. voltage characteristics of an N-channel FET commercially available under the type of 2SK170 as obtained under the condition of $V_{gs}=0$ V, as well as typical current vs. voltage characteristics of a constant-current diode commercially available under the type of E272. This FET exhibits such a characteristic that the current abruptly rises such as a resistor, when the drain-source voltage ranges between 0 and 0.5 V. While, when the drain-source voltage exceeds about 0.5 V, the current starts to gradually increase from the level of 8 mA, thus exhibiting a substantially constant current level, i.e., a constant-current characteristic. Alternatively, the constant-current diode has a transition voltage around about 1.5 V, across which the characteristic is changed from resistance to a constant-current characteristic. From FIG. 3, it will be clear that the characteristic of the CCB circuit according to the present invention is different from that of the conventional CVB circuit exemplarily shown by broken line. Unexpectedly it was found by the present inventor that if an intersection of a solid line of 2SK170 and the broken line of conventional constant-voltage bias circuit were an active bias point, a distinction between the slopes, that is, differential values therebetween, relates to quality of the amplifier to be used.

Figure 4:
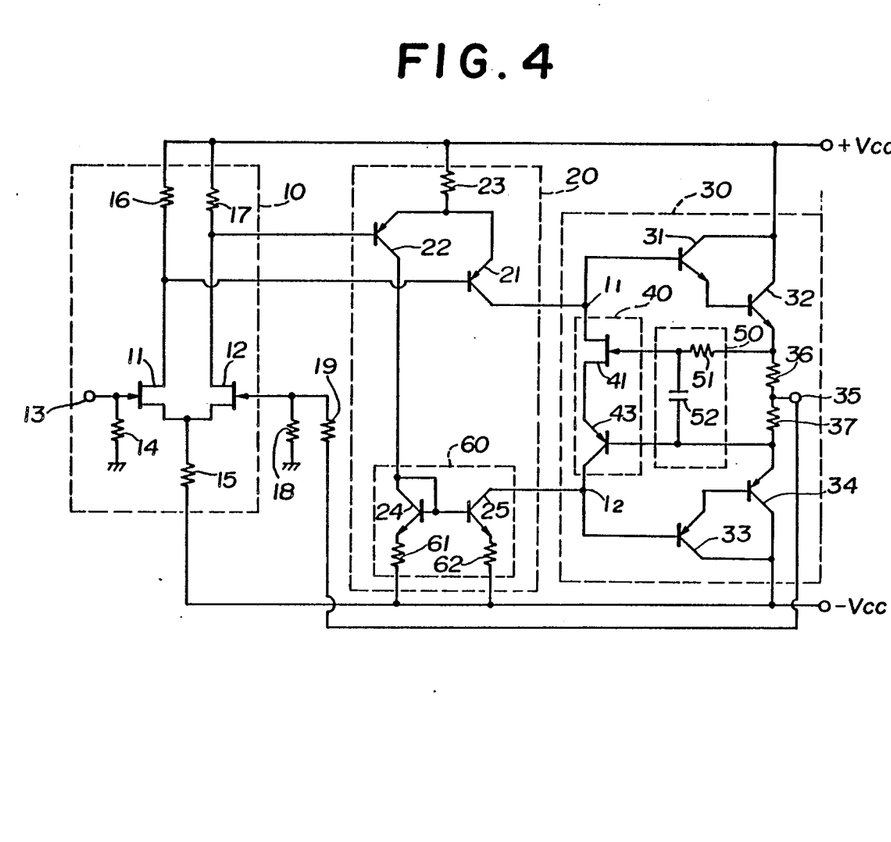
FIG. 4 is a circuit diagram of an embodiment of the amplifier in accordance with the present invention.

FIG. 4 is a circuit diagram of an amplifier according to the present invention comprising negative feedback type CCB circuit. This amplifier comprises a differential input stage 10, a voltage amplified stage 20 and a complementary SEPP output stage 30.

The differential input stage 10 includes, for example, a dual FET IC composed of a pair of FETs 11 and 12 which are integrated on single substrate taking into account the heat equilibrium, an input terminal 13 connected to the gate of FET 11, an input resistor 14 connected between input terminal 13 and the ground, a resistor 15 connected between the common source of FETs 11 and 12 and a negative power supply −Vcc, and resistors 16 and 17 connected between a positive power supply +Vcc and the respective drain of FETs 11 and 12. The gate of FET 12 to the grounding and the output terminal are connected negative feedback resistors 18 and 19 which determine the gain of the amplifier.

The voltage amplified stage 20 includes a PNP transistor 21 having a base connected to the drain of FET 11, a PNP transistor 22 having a base connected to the drain of FET 12, a resistor 23 connected between the common emitter of PNP transistors 21 and 22 and the positive power supply +Vcc, and a current mirror circuit 60 connected to the negative power supply −Vcc. The current mirror circuit 60 is designed to provide the collector current of NPN transistor 25 whose absolute value is same as that of PNP transistor 22. Therefore, NPN transistor 24 having a base and a collector connected to PNP transistor 22 has an emitter connected via resistor 61 to the negative power supply −Vcc. The NPN transistor 25 having a base connected to the base of NPN transistor 24 has an emitter connected to the negative power supply −Vcc via resistor 62 having the same resistance value as that of resistor 61. The collector of PNP transistor 22 provides first relay output terminal I₁ while the collector of NPN transistor 25 provides second relay output terminal I₂ of the voltage amplified stage 20.

The SEPP output stage, which includes the CCB circuit 40 according to the present invention, is connected between first and second relay output terminals I₁ and I₂.

The SEPP output stage 30 has Darlington-connected NPN transistors 31 and 32 each having a collector connected to the positive power supply +Vcc, Darlington-connected PNP transistors 33 and 34 each having a collector connected to the negative power supply −Vcc, an output terminal 35, a first resistor 36 directly connected to output terminal 35 and connected to the emitter of NPN transistor 32, and a second resistor 37 directly connected to output terminal 35 and connected to the emitter of PNP transistor 34. The junction between the emitter of NPN transistor 31 and the base of NPN transistor 32 may be connected to the junction between the emitter of PNP transistor 33 and the base of PNP transistor 34, via a constant current element.

The CCB circuit 40 is connected between first relay output terminal I₁ connected to the base of NPN transistor 31 and second relay output terminal I₂ connected to the base of PNP transistor 33. The CCB circuit 40 receives, via the integration circuit 50, the voltage which appears between one end of output resistor 36 and other end of output resistor 37. The integration circuit 50 includes a resistor 51 connected to one end of output resistor 36 and a capacitor 52 connected to other end of resistor 51 and output resistor 37. For instance, the integration circuit 50 constitutes a primary high-cut filter of 6 db/octave, having a cutoff frequency of 20 Hz. The CCB circuit 40 includes an N-channel junction type FET 41 having a drain connected both to the collector of PNP transistor 21 and the base of NPN transistor 31, and a PNP transistor 43 cascade-connected to FET 41, i.e., having a emitter connected to the source of FET 41. The PNP transistor 43 has a collector connected both to the collector of NPN transistor 25 and the base of PNP transistor 33. The cascade-connected FET 41 and PNP transistor 43 provides a collector current or a drain current which is adjusted by the control voltage applied between the gate of FET 41 and the base of PNP transistor 43. Thus, when the control voltage between the gate and the base is constant, the collector current or a drain current is maintained substantially constant even if a voltage between the first and second relay output terminals $I_1$ and $I_2$ is variable.

A description will be given hereinafter as to the operation of the class AB amplifier of the present invention incorporating the CCB circuit. It is assumed that the composite current amplification factors (collector current/base current) of the respective pairs, i.e., NPN transistors 31 and 32 and PNP transistors 33 and 34 are 1,000. The idling current of NPN transistors 31 and 32 and PNP transistors 33 and 34 in case of no input signal is assumed to be 50 mA. The collector currents of PNP and NPN transistors are assumed to be 5 mA respectively. Since the above-mentioned idle current can be driven with base current of 0.05 mA of NPN and PNP transistors 31 and 34, a bias current of 4.95 mA flows in constant-current circuit 40. The current is set by the voltage which appears between first and second output resistors 36 and 37, for example, 0.1 V.

It is assumed here that a positive signal is applied to input terminal 13 so as to produce a collector current of 5.5 mA in PNP transistor 21. In such a case, a collector current of about 4.5 mA is produced in PNP transistor so that the collector current of NPN transistor 25 of the current mirror circuit 60 is reduced to about 4.5 mA. As a result, the base current of NPN transistor 31 is reduced to 1.05 mA, whereby a positive current of 1.05 A is derived from output terminal 35.

On the other hand, the sum of the drain current of constant-current circuit 40 and the base current of PNP transistor 34 is approximately 4.5 mA. The ratio of the currents shared by the drain current and the base current depends on the base voltage of NPN transistor 31, output voltage and the base voltage of PNP transistor 34. In this case, PNP transistors 33 and 34 are not turned off.

According to the present invention, the drawbacks of the bipolar transistors used in the SEPP output stage are eliminated by the use of the voltage-controlled constant-current bias circuit whose current is controlled by a control voltage. The term "transistor" is used here to include PNP and NPN transistors which are arranged in Darlington and inverted-Darlington connections.

Figure 5:
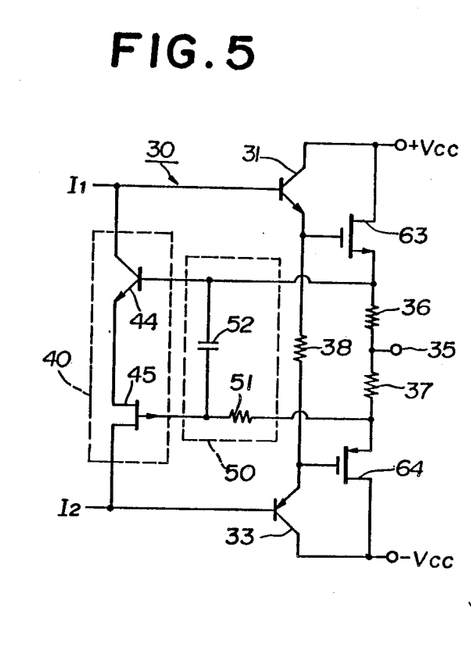
FIG. 5 is a circuit diagram of an amplifier portion of a second embodiment of the present invention.

The amplifier of the present invention comprising the CCB circuit may be applied to MOS type FET as shown in FIG. 5. Thus, a hybrid circuit composed of bipolar transistors and N- and P-channel MOSFETs 63 and 64 can be connected to this amplifier. Alternatively, other types of amplifier elements such as junction-type FETs or SITs can be used. In FIG. 5, the same reference numerals are used to denote the elements corresponding to those appearing in FIG. 1. More specifically, this CCB circuit 40 is composed of an NPN transistor 44 having a collector connected to the base of NPN transistor 31, and a junction-type P-channel FET 45 having a source connected to the emitter of NPN transistor 44. The drain of P-channel FET 45 is connected to the base of PNP transistor 33, while the base of NPN transistor is connected to one end of first output resistor 36. The gate of P-channel FET 45 is connected to other end of first output resistor 37 through a resistor 51. A capacitor 52 is connected between the base of NPN transistor 44 and the gate of P-channel FET 45.

The N-channel MOSFET 63 has a drain connected to the positive power supply, a gate connected to the emitter of NPN transistor 31 and a source connected to one end of output resistor 36. On the other hand, the P-channel MOSFET 64 has a drain connected to the negative power supply, a gate connected to the emitter of PNP transistor 33 and a source connected to first output resistor 37. In order to produce a bias current having good frequency characteristics, a resistor 38 is connected between the emitters of NPN transistor 31 and PNP transistor 33.

The integration circuit 50 may employ a high-cut filter of second or higher order.

Figure 6:
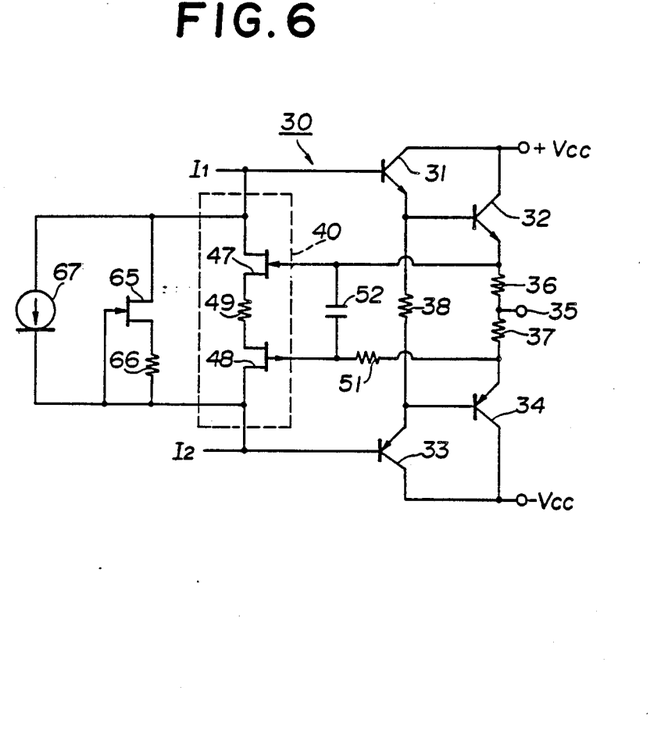
FIG. 6 is a circuit diagram of an amplifier portion of a third embodiment of the present invention.

FIG. 6 shows a portion of a third embodiment of the amplifier of the present invention having the CCB circuit.

This CCB circuit 40 includes a junction-type N-channel FET 47 and a junction type P-channel FET 48 having a source connected to the source of N-channel FET 47 via a resistor 49. An integrated value of the voltage appearing at both ends of the serial-connected output resistors 36 and 37 is applied between the gates of N- and P-channel FETs.

This constant-current circuit serves also temperature compensation means for NPN transistor 31 and PNP transistor 33. It is, therefore, possible to connect a constant-current element 67 or an N-channel FET 65 of constant-current connection, in parallel with the constant current circuit as shown in FIG. 6. A resistor 66 is intended for adjusting the drain current for the purpose of obtaining a predetermined constant current.

Figure 7:
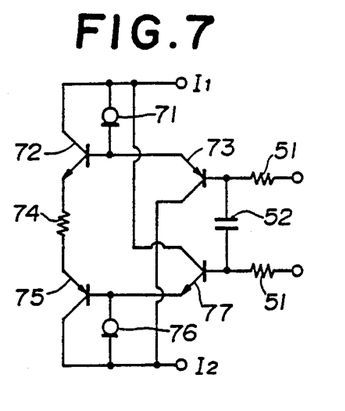
FIG. 7 is a circuit diagram of the third example of the CCB circuit used in the present invention.

FIG. 7 shows a different example of the CCB circuit. This circuit includes a constant-current diode 71 having an anode connected to first relay output terminal $I_1$, an NPN transistor 72 having a base and a collector connected to the cathode of constant-current diode 71 and first relay output terminal $I_1$ respectively, a PNP transistor 73 having an emitter and a collector connected to the cathode of constant-current diode 71 and second relay output terminal $I_2$ respectively, a resistor 74 having one end connected to the emitter of NPN transistor 72, a PNP transistor 75 having an emitter and a collector connected to other end of resistor 74 and second relay output terminal $I_2$ respectively, a constant-current diode 76 having an anode and a cathode connected to the base of PNP transistor 75 and second relay output terminal $I_2$ respectively, and an NPN transistor 77 having a collector and an emitter connected to first relay output terminal $I_1$ and the anode of constant-current diode 76 respectively. In the operation of this circuit, the current flowing through resistor 74 is controlled in accordance with the voltage which is applied between the bases of PNP transistor 73 and NPN transistor 77. The constant-current diodes in this circuit may be substituted by resistors.

Figure 8:
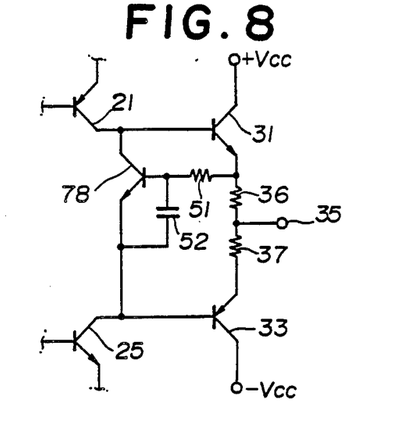
FIG. 8 is a circuit diagram of a fourth example of the CCB circuit used in the present invention.

The CCB circuit used in the amplifiers of FIGS. 4 to 7 are suitable for two or three-stage Darlington-connected SEPP output stage. When the SEPP output stage is a single stage as shown in FIG. 8, since the voltage $V_{bb}$ between the bases of NPN transistor 31 and PNP transistor 33 is about 1.3 V, it is preferred that the emitter voltage of PNP transistor 33 to be driven is controlled from the base (control end) side.

In the SEPP output stage comprising an NPN transistor 31 having a collector connected to the positive power supply $+V_{cc}$ and an emitter connected to one end of resistor 36, an output terminal 35 connected to other end of resistor 36 and also to one end of resistor 37, and a transistor 33 having an emitter connected to other end of resistor 37 and a collector connected to the negative power supply $-V_{cc}$, this CCB circuit includes an NPN transistor 78 having a collector connected to the base of NPN transistor 31 and an emitter connected to the base of PNP transistor 33. Thus, the integration circuit 50 includes a resistor 51 connected to the base of NPN transistor 78 and one end of resistor 36, and a capacitor 52 connected between the base and the emitter of NPN transistor 78.

In this feedback-type CCB circuit, when the power supply is turned on, a rush idle current flows through the emitters of the power transistors during charge up the capacitor 52 of the integration circuit. It is possible to set the level of this rush idle current within the ASO region of the power transistor, by making use of the CCB circuit 40 shown in FIG. 6. More specifically, assuming here that the bias current flowing between FETs 47 and 48 is 2 mA, it is advisable to use FETs 47, 48 having absolute values of $I_{dss}$ not small than 8 mA, so as to adjust resistor 49 thereby setting the bias current to the level of 2 mA. The typical mutual conductance gm of FETs 47, 48 is preferably not smaller than 30 mS. According to this arrangement, when FETs 47 and 48 operate, the voltage $V_{ss}$ between the sources becomes about 20 times as high as the voltage $V_{gg}$ between the gates, whereby the width of fluctuation of the bias current can be decreased.

In the amplifier comprising a SEPP output stage composed of three or more stages of Darlington-connected power transistors, there is a risk for the power transistors of the output stage to be broken by the rush idle current. In order to obviate such a problem, it is preferred that a delay circuit is used in combination with a conventional CVB circuit in such a manner that the conventional CVB circuit operates for a certain period of 2 to 0 second after the turning on of the power supply.

Figure 9:
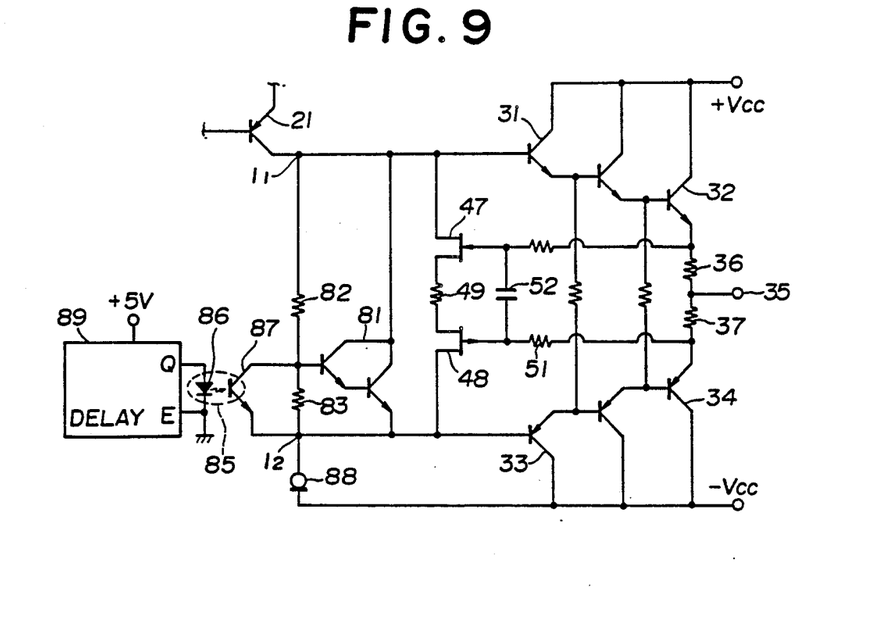
FIG. 9 is a circuit diagram illustrating a CCB circuit having a protecting circuit for preventing rush-idle current at which the power is supplied.

FIG. 9 is a portion of an amplifier including a CCB circuit of the present invention, an on-off controllable CVB circuit, a delay circuit for delaying a signal for a predetermined period after turning on of the power supply, and an isolator designed to turn off the constant-voltage circuit only in response to the above signal. The CCB circuit is not described because it is similar to that of FIG. 6. The CVB circuit comprises a Darlington-connected NPN transistor 81 having a common collector connected to relay output terminal $I_1$ and an emitter connected to a relay output terminal $I_2$, a resistor 82 having a high resistance value connected both to relay output terminal $I_1$ and the base of NPN transistor 81, and a resistor 83 having a high resistance value and connected to the base of NPN transistor 81 and relay output terminal $I_2$. The isolator 85 is for example a photo-coupler composed of a light-emitting diode 86 having an anode connected to the output terminal Q of the delay circuit 89 and a cathode connected to the grounding, and a photo-transistor 87 having a collector and a base connected to the base of NPN transistor 81 and the emitter of the same. The delay circuit 89 has a CMOS-type monostable multivibrator which may be a model MC14528 available from Motorola Inc. A constant-current diode 88 or similar circuit is connected between the base and the collector of PNP transistor 33.

The described embodiments are sought to make the most of the advantages of the CCB circuit in accordance with the present invention. Preferably, the present invention may be applied to operational amplifiers such as TL-08X series available from Texas Instruments Inc., uA741 of Fairchild or 4558, in such a manner that the CCB circuit according to the invention is used in parallel with a reduced conventional CVB circuit whose capacity has been reduced from that obtained before the improvement. More specifically, the monolithic integrated circuit constituting the amplifier can be fabricated by forming, on a substrate of, for example, P type, active elements such as transistors or resistors, and connecting the electrode portions of these elements through, for example, aluminium evapo-deposit lines. In this type of device, therefore, it is easy to obtain correlations of temperature coefficients between elements as compared with that of hybrid-type amplifiers. It is also possible to obtain a higher value of the ratio between the bias current borne by the CCB circuit according to the invention and the bias current borne by the CVB circuit, as compared with hybrid-type amplifiers. This improvement can easily be implanted on conventional monolithic operational amplifiers. More specifically, the region occupied by the conventional CVB circuit is partitioned for example at a ratio of 1:9, and the conventional CVB circuit is scaled down within the region corresponding to "1", while the CCB circuit such as a constant-current diode or a constant-current-connected FET is formed in the region corresponding to "9". Although this CCB circuit has a performance 0.9 times less than that of the conventional CVB circuit, the layout of the circuit can be appreciably facilitated because it is possible to make use of the vacant region on the substrate around the bias circuit and because only two connecting lines are required.

Figure 10:
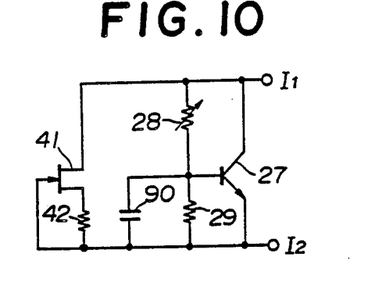
FIG. 10 is a circuit diagram of a CCB circuit designed for a large current.

FIG. 10 shows an embodiment teaching such an application. This embodiment has a bias circuit composed of a parallel connection of a CCB circuit and a CVB circuit.

The CCB circuit comprises a FET 41 having a drain connected to relay output terminal $I_1$ and a gate connected to relay output terminal $I_2$, and a resistor 42 connected between the source of FET 41 and relay output terminal $I_2$. On the other hand, the CVB circuit includes an NPN transistor 27 having a collector and a base connected to relay output terminals $I_1$ and $I_2$ respectively, a variable resistor 28 connected between relay output terminal $I_1$ and the base of NPN transistor 27, and a resistor 29 connected between the base of NPN transistor 27 and relay output terminal $I_2$. The capacitor 90 is intended for imparting constant-current characteristic to the CVB circuit. The capacitor 90 has for example a capacitance of 100 uF, and is connected between the base of NPN transistor 27 and relay output terminal $I_2$. The capacitor 27 is provided for imparting constant-current characteristic to the conventional CVB circuit.

A description will be made hereinafter as to the method of determining the shares or proportions of the current to be borne by the CCB circuit and the CVB circuit.

An operation temperature range to the amplifier is for example between 0° and 70° C. according to the commercial regulations. Within this operation temperature range, the basic value A and fluctuation width B or ($A \pm B$) of the bias current flowing between both relaying points $I_1$ and $I_2$ is calculated or predicted. Subsequently, the basic value C and fluctuation width D or ($C \pm D$) of the current flowing through the CCB circuit is obtained to set the current value of the CCB circuit at appropriate operative temperature so that the electric current is determined to meet with the condition of ($C+D$)$\leq$A. The remained bias current is absorbed by or passed through a CVB circuit whose internal resistance has been increased about (A−B)/B times. The values A, B, C and D are all positive.

In an improved amplifier as an embodiment of the present invention, which is obtained by improving the conventional amplifier, the conventional bias current is initially measured. The FET 41 and resistor 42 are selected so that 99 to 80% of the measured current flow through the CCB circuit, while the remained current is supplied to a CVB circuit by setting the values of the variable resistors 28 and 29 between 1/(1−0.99) and 1/(1−0.8) times higher than that of the conventional corresponding resistors.

Figure 11:
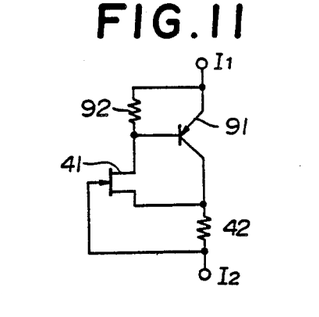
FIG. 11 is a circuit diagram of a CCB circuit connected in parallel to a conventional CVB circuit which has a reduced constant-voltage effect.

FIG. 11 shows a circuit suitable for use in which the current supplied to the CCB circuit exceeds for example 10 mA since the $I_{dss}$ of FET 41 is usually not greater than 10 mA.

This circuit comprises a PNP transistor 91 having a emitter connected to relay output terminal $I_1$, a FET 41 having a drain connected to the base of PNP transistor 91 and a gate connected to relay output terminal $I_2$, a resistor 92 connected to relay output terminal $I_1$ and the base of PNP transistor 91, and a resistor 42 connected to the junction point between the collector of PNP transistor 91 and the source of FET 41 and to relay output terminal $I_2$.

Figure 12:
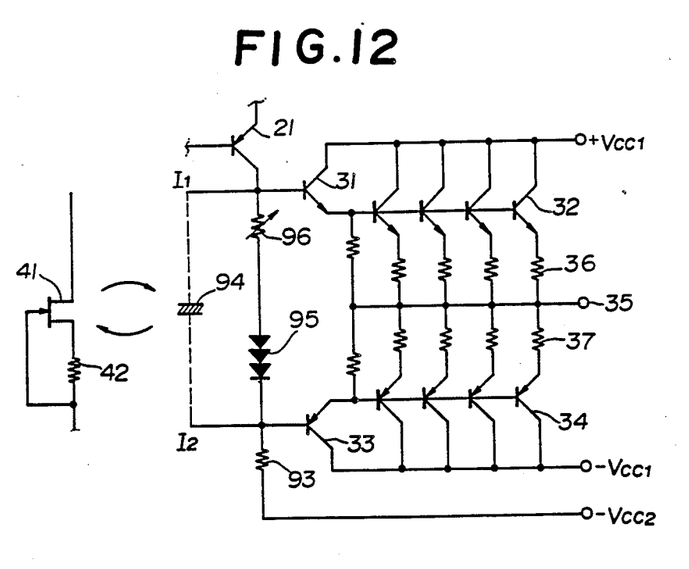
FIG. 12 is a circuit diagram of a class AB amplifier composed of a CCB circuit constructed in accordance with the invention and connected in parallel to a diode-type bias circuit of a class A amplifier.

FIG. 12 is a partial circuit diagram constituting a class-AB amplifier which is obtained be connecting a CCB circuit according to the present invention in parallel with a conventional bias circuit of a class A amplifier (Model No. M-4, commercially available from Pioneer Corporation, Japan) which is said to be one capable of providing the highest quality of sound amongst all existing amplifiers.

This circuit has four parallel NPN transistor 32 and four parallel PNP transistor 34, as well as a variable resistor 96 connected at its one end to relay output terminal $I_1$ and a constant-voltage element 95 having an anode connected to other end of the variable resistor 96. The constant-voltage element 95 has three temperature-compensation diodes connected in series and sealed in a resin container having a high heat conductivity, and is connected at its cathode to relay output terminal $I_2$. The constant-voltage element 95 thus constructed is attached to heat-radiating fins (or cooler) to which are attached the four sets of transistors 32 and 34 mentioned above. It seems that the designer of the class A amplifier has connected an electrolytic capacitor 94 between relay output terminals $I_1$ and $I_2$ for purpose of attaining a higher degree of constant of the voltage between relay output terminals $I_1$ and $I_2$. The modification done by me of merely to eliminate the capacitor 94, the CCB circuit according to the present invention which restrains only the current level. Before the improvement, the heat-radiation fins exhibited such a high temperature as could never be touched by human hand even 2 to 10 minutes after the operation. However, in the improved amplifier, the heat-radiation fins are maintained at such a temperature as can be touched by human hand during the operation. This suggests that the class of the amplifier has changed from class A to class AB.

A test was conducted by four listeners including me, for purpose of comparison between the quality of sound produced by the amplifier before improvement and that of the sound produced by the improved amplifier. Although there was an interval of about 3 hours for the improvement, all the four listeners judged that the sound quality has been refined as the result of improvement of the amplifier. Through the test, the same system and source were used without any change, except for the modification specifically mentioned above.

INDUSTRIAL APPLICABILITY

As will be understood from the foregoing description, according to the present invention, the bipolar transistors of the positive and negative source sides of the output stage are never turned off, so that dynamic distortion of the output signal can be reduced. In addition, the class AB power amplifier incorporating the constant-current circuit according to the present invention does not cause the power NPN and PNP transistors to be turned off, even when it is applied to an inductive load such as speaker etc, whereby the sound can be reproduced with high degree of reality even though it is delicate. Thus, the amplifier of the present invention can be used in private or business acoustic instruments or PAs. In particular, the amplifier of the present invention is suitable for use as an integrated circuit type operational amplifier of music instruments other than the above-mentioned instruments.

What is claimed is:

1. An amplifier comprising:
    an input stage having an inverting input terminal and a non-inverting input terminal;
    a voltage amplifier stage operatively connected to said input stage and having first and second relay output terminals;
    a SEPP output stage including a first transistor having a base connected to said first relay output terminal and an emitter connected to one end of a first resistor, an output terminal directly connected to another end of said first resistor and to one end of a second resistor, and a second transistor having a base connected to said second relay output terminal and an emitter connected to another end of said second resistor, said second transistor having a polarity opposite to said first transistor; and
    a voltage-controlled constant current bias circuit connected between said first and second relay output terminals and controlling a value of the constant current flowing through said first and second relay output terminals in response to a control voltage that is a mean value of a voltage between said one end of the first resistor and said other end of the second resistor via a high-cut filter, said voltage-controlled constant current bias circuit being free of direct connection with said output terminal.

2. An amplifier according to claim 1, wherein said high-cut filter includes an integrating resistor and a capacitor, said voltage-controlled constant current bias circuit including:
    a junction-type N-channel FET having a drain connected to said first relay output terminal and a gate connected to said one end of said first resistor via said integrating resistor; and
    a PNP transistor having an emitter connected to a source of said N-channel FET, a collector connected to the second relay output terminal and a base connected to said another end of said second resistor, said capacitor being connected between the gate of said N-channel FET and the base of said PNP transistor.

3. An amplifier according to claim 1, wherein said high-cut filter includes an integrating resistor and a capacitor, said voltage-controlled constant current bias circuit including:

a NPN transistor having a collector connected to the first relay output terminal and a base connected to one end of said first resistor; and a junction-type P-channel FET having a source connected to the emitter of said NPN transistor, a drain connected to said second relay output terminal and a gate connected to said another end of said second resistor via said integrating resistor, said capacitor being connected between the base of said NPN transistor and the gate of said P-channel FET.

4. An amplifier according to claim 1, wherein said high-cut filter includes first integrating resistor, a second integrating resistor and a capacitor said voltage-controlled constant current bias circuit includes:

a junction-type N-channel FET having a drain connected to said first relay output terminal and a gate connected said one end of said first resistor via said first integrating resistor;

a junction-type P-channel FET having a source connected to the source of said N-channel FET, a drain connected to said second relay output terminal and a gate connected to said another end of said second resistor via said second integrating resistor, said capacitor being connected between the gate of said N-channel FET and the gate of said P-channel FET.

5. An amplifier comprising:

an input stage having an inverting input terminal and a non-inverting input terminal;

a voltage amplifier stage operatively connected to said input stage and having first and second relay output terminals;

a SEPP output stage including a NPN transistor having a base connected to said first relay output terminal and an emitter connected to one end of a first resistor, an output terminal directly connected to another end of said first resistor and to one end of a second resistor, and a PNP transistor having a base connected to said second relay output terminal and an emitter connected to another end of said second resistor;

a second NPN transistor having a collector connected to said first relay output terminal, an emitter connected to said second relay output terminal and a base connected to said one end of the first resistor via a resistor, said second NPN transistor being free of direct connection with said output terminal; and a capacitor connected between the base and the emitter of said second NPN transistor.

6. An amplifier comprising:

an input stage having an inverting input terminal and a non-inverting input terminal;

a voltage amplifier stage operatively connected to said input stage and having first and second relay output terminals;

a SEPP output stage including a first transistor having a base connected to said first relay output terminal and an emitter connected to one end of a first resistor, an output terminal directly connected to another end of said first resistor and to one end of a second resistor, and a second transistor opposite in conductivity to said first transistor having a base connected to said second relay output terminal and an emitter connected to another end of said second resistor;

a bipolar transistor connected to said first relay output terminal via a connection line and connected to said second relay output terminal and having a base connected to be responsive to a voltage developed in response to a current flowing through said first and second resistors, said bipolar transistor being free of direct connection with said output terminal; and a capacitor connected between the base of said bipolar transistor and said connection line.

* * * * *